(12) United States Patent
Mack et al.

(10) Patent No.: US 9,188,974 B1
(45) Date of Patent: Nov. 17, 2015

(54) METHODS FOR IMPROVED MONITOR AND CONTROL OF LITHOGRAPHY PROCESSES

(75) Inventors: Chris Mack, Austin, TX (US); Moshe E Preil, Sunnyvale, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 949 days.

(21) Appl. No.: 13/184,565

(22) Filed: Jul. 17, 2011

Related U.S. Application Data (62) Division of application No. 10/778,752, filed on Feb. 13, 2004, now abandoned.

(51) Int. Cl.
G06F 19/00 (2011.01)
G05B 19/418 (2006.01)
G06Q 10/06 (2012.01)

(52) U.S. Cl.
CPC .......... *G05B 19/41875* (2013.01); *G06Q 10/06* (2013.01)

(58) Field of Classification Search
CPC ................................................ G05B 19/41875
USPC .................... 700/95, 108, 110; 702/183, 184; 340/3.43, 3.44
See application file for complete search history.

(56) References Cited

U.S. PATENT DOCUMENTS

| | | |
|---|---|---|
| 5,696,835 A | 12/1997 | Hennessey et al. |
| 5,703,969 A | 12/1997 | Hennessey et al. |
| 5,884,242 A | 3/1999 | Meier et al. |
| 5,940,458 A | 8/1999 | Suk |
| 5,965,306 A | 10/1999 | Mansfield et al. |
| 5,991,699 A | 11/1999 | Kulkarni et al. |
| 6,014,461 A | 1/2000 | Hennessey et al. |
| 6,091,846 A | 7/2000 | Lin et al. |

(Continued)

FOREIGN PATENT DOCUMENTS

| | | |
|---|---|---|
| WO | 00/36525 | 6/2000 |
| WO | 03/104921 | 12/2003 |

OTHER PUBLICATIONS

Allan et al., "Critical Area Extraction for Soft Fault Estimation," IEEE Transactions on Semiconductor Manufacturing, vol. 11, No. 1, Feb. 1998.

(Continued)

*Primary Examiner* — Mohammad Ali
*Assistant Examiner* — Ziaul Karim
(74) *Attorney, Agent, or Firm* — Ann Marie Mewherter (57) ABSTRACT

Various computer-implemented methods are provided. One method includes determining errors across a field of a lens of a lithography system based on wafer measurements. In addition, the method includes separating the errors into correctable and non-correctable errors across the field. The errors may include dose errors, focus errors, or dose and focus errors. In another embodiment, the method may include determining correction terms for parameter(s) of the lithography system, which if applied to the parameter(s), the correctable errors would be eliminated resulting in approximately optimal imaging performance of the lithography system. Another method includes controlling one or more parameters of features within substantially an entire printed area on a product wafer using a limited number of wafer measurements performed on a test wafer. The wafer measurements may be performed on a first feature type, and the features that are controlled may include a second, different feature type.

27 Claims, 2 Drawing Sheets

(56) References Cited

U.S. PATENT DOCUMENTS

| | | |
|---|---|---|
| 6,146,627 A | 11/2000 | Muller |
| 6,205,239 B1 | 3/2001 | Lin et al. |
| 6,248,485 B1 | 6/2001 | Cuthbert |
| 6,248,486 B1 | 6/2001 | Dirksen et al. |
| 6,259,960 B1 | 7/2001 | Inokuchi |
| 6,268,093 B1 | 7/2001 | Kenan et al. |
| 6,292,582 B1 | 9/2001 | Lin et al. |
| 6,373,975 B1 | 4/2002 | Bula et al. |
| 6,415,421 B2 | 7/2002 | Anderson et al. |
| 6,445,199 B1 | 9/2002 | Satya et al. |
| 6,451,690 B1 | 9/2002 | Matsumoto |
| 6,470,489 B1 | 10/2002 | Chang et al. |
| 6,483,938 B1 | 11/2002 | Hennessey et al. |
| 6,526,164 B1 | 2/2003 | Mansfield et al. |
| 6,529,621 B1 | 3/2003 | Glasser et al. |
| 6,581,193 B1 | 6/2003 | McGhee et al. |
| 6,631,511 B2 | 10/2003 | Haffner |
| 6,651,226 B2 | 11/2003 | Houge et al. |
| 6,658,640 B2 | 12/2003 | Weed |
| 6,691,052 B1 | 2/2004 | Maurer |
| 6,718,526 B1 | 4/2004 | Eldredge et al. |
| 6,721,695 B1 | 4/2004 | Chen et al. |
| 6,753,954 B2 | 6/2004 | Chen |
| 6,757,645 B2 | 6/2004 | Chang |
| 6,775,818 B2 | 8/2004 | Taravade et al. |
| 6,777,676 B1 | 8/2004 | Wang et al. |
| 6,778,695 B1 | 8/2004 | Schellenberg et al. |
| 6,788,400 B2 | 9/2004 | Chen |
| 6,803,554 B2 | 10/2004 | Ye et al. |
| 6,806,456 B1 | 10/2004 | Ye et al. |
| 6,807,503 B2 | 10/2004 | Ye et al. |
| 6,813,572 B2 | 11/2004 | Satya et al. |
| 6,820,028 B2 | 11/2004 | Ye et al. |
| 6,828,542 B2 | 12/2004 | Ye et al. |
| 6,879,924 B2 | 4/2005 | Ye et al. |
| 6,882,745 B2 | 4/2005 | Brankner |
| 6,884,984 B2 | 4/2005 | Ye et al. |
| 6,886,153 B1 | 4/2005 | Bevis |
| 6,892,156 B2 | 5/2005 | Ye et al. |
| 6,902,855 B2 | 6/2005 | Peterson et al. |
| 6,906,305 B2 | 6/2005 | Pease et al. |
| 6,959,255 B2 | 10/2005 | Ye et al. |
| 6,966,047 B1 | 11/2005 | Glasser |
| 6,969,837 B2 | 11/2005 | Ye et al. |
| 6,969,864 B2 | 11/2005 | Ye et al. |
| 7,003,755 B2 | 2/2006 | Pang et al. |
| 7,003,758 B2 | 2/2006 | Ye et al. |
| 7,030,966 B2 | 4/2006 | Hansen |
| 7,030,997 B2 | 4/2006 | Neureuther et al. |
| 7,053,355 B2 | 5/2006 | Ye et al. |
| 7,061,625 B1 | 6/2006 | Hwang |
| 7,106,895 B1 | 9/2006 | Goldberg et al. |
| 7,107,517 B1 | 9/2006 | Suzuki et al. |
| 7,107,571 B2 | 9/2006 | Chang et al. |
| 7,111,277 B2 | 9/2006 | Ye et al. |
| 7,114,145 B2 | 9/2006 | Ye et al. |
| 7,117,477 B2 | 10/2006 | Ye et al. |
| 7,117,478 B2 | 10/2006 | Ye et al. |
| 7,120,895 B2 | 10/2006 | Ye et al. |
| 7,123,356 B1 | 10/2006 | Stokowski |
| 7,124,386 B2 | 10/2006 | Smith |
| 7,135,344 B2 | 11/2006 | Nehmadi |
| 7,136,143 B2 * | 11/2006 | Smith .......................... 355/52 |
| 7,152,215 B2 | 12/2006 | Smith |
| 7,171,334 B2 | 1/2007 | Gassner |
| 7,174,520 B2 | 2/2007 | White |
| 7,194,709 B2 | 3/2007 | Brankner |
| 7,207,017 B1 | 4/2007 | Tabery et al. |
| 7,231,628 B2 | 6/2007 | Pack et al. |
| 7,236,847 B2 | 6/2007 | Marella |
| 7,379,175 B1 | 5/2008 | Stokowski et al. |
| 7,382,447 B2 | 6/2008 | Mieher et al. |
| 7,383,521 B2 * | 6/2008 | Smith et al. ..................... 716/114 |
| 7,570,796 B2 | 8/2009 | Zafar et al. |
| 7,570,800 B2 | 8/2009 | Lin et al. |
| 7,676,077 B2 | 3/2010 | Kulkarni et al. |
| 7,689,966 B2 | 3/2010 | Verma et al. |
| 7,711,514 B2 | 5/2010 | Park et al. |
| 7,877,722 B2 | 1/2011 | Kulkarni et al. |
| 8,001,516 B2 * | 8/2011 | Smith et al. ..................... 716/136 |
| 8,041,103 B2 | 10/2011 | Kulkarni et al. |
| 2002/0026626 A1 | 2/2002 | Randall et al. |
| 2002/0035641 A1 | 3/2002 | Kurose |
| 2002/0088951 A1 | 7/2002 | Chen |
| 2002/0144230 A1 | 10/2002 | Rittman |
| 2003/0014146 A1 | 1/2003 | Fujii |
| 2003/0022401 A1 | 1/2003 | Hamamatsu et al. |
| 2003/0033046 A1 | 2/2003 | Yoshitake et al. |
| 2003/0048458 A1 | 3/2003 | Mieher et al. |
| 2003/0098970 A1 | 5/2003 | Chen |
| 2003/0223639 A1 | 12/2003 | Shlain et al. |
| 2003/0228714 A1 | 12/2003 | Smith |
| 2003/0229410 A1 * | 12/2003 | Smith et al. ..................... 700/109 |
| 2003/0229412 A1 | 12/2003 | White |
| 2003/0229868 A1 | 12/2003 | White |
| 2003/0229875 A1 | 12/2003 | Smith |
| 2003/0229880 A1 | 12/2003 | White |
| 2003/0229881 A1 | 12/2003 | White |
| 2004/0107412 A1 | 6/2004 | Pack et al. |
| 2004/0174506 A1 | 9/2004 | Smith |
| 2005/0004774 A1 | 1/2005 | Volk et al. |
| 2005/0132306 A1 | 6/2005 | Smith et al. |
| 2005/0166174 A1 | 7/2005 | Ye et al. |
| 2005/0190957 A1 | 9/2005 | Cai |
| 2006/0051682 A1 | 3/2006 | Hess et al. |
| 2006/0062445 A1 | 3/2006 | Verma et al. |
| 2006/0082763 A1 | 4/2006 | Teh et al. |
| 2006/0161452 A1 | 7/2006 | Hess |
| 2006/0236294 A1 | 10/2006 | Saidin et al. |
| 2006/0269120 A1 | 11/2006 | Nehmadi et al. |
| 2006/0273242 A1 | 12/2006 | Hunsche et al. |
| 2006/0273266 A1 | 12/2006 | Preil et al. |
| 2006/0291714 A1 | 12/2006 | Wu et al. |
| 2007/0019171 A1 | 1/2007 | Smith |
| 2007/0031745 A1 | 2/2007 | Ye et al. |
| 2007/0032896 A1 | 2/2007 | Ye et al. |
| 2007/0035712 A1 | 2/2007 | Gassner et al. |
| 2007/0035728 A1 | 2/2007 | Kekare et al. |
| 2007/0052963 A1 | 3/2007 | Orbon |
| 2008/0013083 A1 | 1/2008 | Kirk et al. |
| 2008/0167829 A1 | 7/2008 | Park et al. |
| 2008/0218714 A1 * | 9/2008 | Uehara et al. ..................... 355/53 |
| 2011/0153265 A1 * | 6/2011 | Staals et al. ..................... 702/150 |

OTHER PUBLICATIONS

Dirksen et al., "Novel aberration monitor for optical lithography," Proc. of SPIE vol. 3679, p. 77-86 (1999).

Dirksen et al., "Impact of high order aberrations on the performance of the aberration monitor," Proc. of SPIE vol. 4000, pp. 9-17 (2000).

Lo et al., "Identifying Process Window Marginalities of Reticle Designs for 0.15/0.13 mm Technologies," Proceedings of SPIE vol. 5130, 2003, pp. 829-837.

Lorusso et al., "Advanced DFM Applns. Using design-based metrology on CDSEM," SPIE vol. 6152, Mar. 27, 2006.

Mack, "Lithographic Simulation: A Review," Proceedings of SPIE vol. 4440, 2001, pp. 59-72.

Svidenko et al., "Dynamic Defect-Limited Yield Prediction by Criticality Factor," ISSM Paper: YE-O-157, 2007.

Volk et al., "Investigation of Smart Inspection of Critical Layer Reticles using Additional Designer Data to Determine Defect Significance," Proceedings of SPIE vol. 5256, 2003, pp. 489-499.

U.S. Appl. No. 60/451,707 to Howard et al. filed Mar. 4, 2003.

U.S. Appl. No. 10/793,599 to Howard et al. filed Mar. 4, 2004.

U.S. Appl. No. 11/154,310 to Verma et al. filed Jun. 16, 2005.

* cited by examiner

METHODS FOR IMPROVED MONITOR AND CONTROL OF LITHOGRAPHY PROCESSES

CROSS-REFERENCE TO RELATED APPLICATIONS

This application is a divisional of U.S. patent application Ser. No. 10/778,752 entitled "Methods for Improved Monitor and Control of Lithography Processes," filed Feb. 13, 2004, which is incorporated by reference as if fully set forth herein.

BACKGROUND OF THE INVENTION

1. Field of the Invention

The present invention generally relates to methods and systems for improved monitor and control of lithography processes. Certain embodiments relate to a computer-implemented method for separating errors into correctable and non-correctable errors across a field of a lens of a lithography system. Other embodiments relate to a computer-implemented method for controlling one or more parameters of features within substantially an entire printed area on a product wafer.

2. Description of the Related Art

The performance of a lithography system lens has an impact on the features that are printed by the lithography system. Currently, there are two basic methods used to track lens performance. In the simplest approach, the user measures critical dimensions (CDs) for different feature types at a large number of points across the lens field. The raw CD measurement method is simple and well understood. The metrology results will show if the range of CD values measured across the field are within the specification limits or not. Pass/fail decisions are made based on the range of the measured values or another statistical summary of the results. For example, all of the data may be pooled together to get an overall CD distribution. The lens passes if the width of the distribution is within spec.

No other information on lens quality is collected. The exception is that vertical and horizontal features may be looked at separately, which could indicate an astigmatism problem if there is a marked offset between the two. For example, the CD of horizontal and vertical features, usually at fixed CD and pitch but sometimes at a few different values of CD and pitch, may also be measured. CD measurements may also be performed in a few fields at + and − defocus. Global tilt may be removed from the data, but is inadvisable. The process of lumping all of the data together and computing the range is fairly simple, even if flier rejection algorithms are included.

However, due to the interaction between different feature types and the optical aberrations of the lens system, a great number of measurements may be required on different types of features at different locations in the lens field. In addition, the results are equally simplistic. For example, there is no indication of the spatial pattern of the CD distribution and no way to tell if specific locations within the lens field are behaving anomalously. This approach makes it difficult to detect spatial drifts, i.e., changes in the performance of specific locations in the lens over time, or changes in the spatial signature of the lens over time. More importantly, it also makes it difficult (if not impossible) to tell why the lens performance is changing. For example, if the CDs on the right side of the lens begin to be larger than those on the left, it is not possible to determine if there is a problem in the lens itself or just a tilt of the field which could easily be corrected in the focusing system. If the user just subtracts an average value to try to compensate the tilt, the user could miss seeing a serious problem. Therefore, it is not possible to determine if the cause of any excessive CD variation is due to systematic, correctable terms such as a focus offset or focal plane tilt or if the variation is due to non-correctable terms. This method cannot separate correctable from non-correctable contributions to the CD error.

A more complex method is to determine the Zernike aberrations across the pupil plane of the lens as viewed from any point in the lens field. Examples of methods that may be used to determine lens aberrations are illustrated in U.S. Pat. No. 6,248,486 to Dirksen et al., "Novel aberration monitor for optical lithography," P. Dirksen et al., Proc. of SPIE Vol. 3679, p. 77-86 (1999), and "Impact of high order aberrations on the performance of the aberration monitor," P. Dirksen et al., Proc. of SPIE Vol. 4000, pp. 9-17 (2000), which are incorporated by reference as if fully set forth herein. Knowing the Zernike coefficients, the CD of any feature can be simulated based on how the image will be projected through the pupil plane.

The method involving the determination of the Zernike aberration coefficients is more rigorous, but also much more difficult to apply in practice and does not provide a direct measurement of the CD performance on the wafer. CDs can be predicted through simulation, but the results will be imperfect due to other lens errors, especially flare, and the detailed interaction of the light with the photoresist. It is difficult to negotiate pass/fail specifications with suppliers based on Zernike values due to the highly proprietary nature of lens design. If a lens fails a qualification test due to one or more Zernike terms being out of spec, the supplier would still insist on time consuming tests to prove that the lens performance has been degraded beyond its specifications for specific photoresist features. Although a large number of methods to determine Zernike coefficients have been proposed, many of these lack adequate sensitivity to the lowest order terms to determine the focal plane error (Z0) at each point in the lens field.

The lithography process often plays a significant role in the success or failure of semiconductor manufacturing. Therefore, lithography processes are often closely monitored for process control purposes. Some methods for monitoring lithography process performance involve measuring features printed on a wafer. For example, currently, users measure a metrology test target (often a "tuning fork" with an isolated and dense array at a fixed CD) at a limited number of points within the scribe line. In some cases, users may also measure the CD at a very limited number of points within the device die itself. If the metrology measurements are within specified limits ("in spec"), the entire lot of wafers is assumed to be acceptable.

A state of the art integrated circuit will have tens or hundreds of millions of structures, all of which must be within spec in order for the device to function properly. These structures will vary widely across the circuit including isolated and dense structures as well as those of intermediate pitch and with varying target CDs across the device. Some process layers may contain mixtures of lines and spaces or contact holes and linear patterns. Knowing that a limited number of test structures within the scribe line is in spec for a fixed CD and a fixed pitch is not a clear indication that all of the device geometries everywhere within the device are within acceptable limits. In addition, the change in dose or focus which will give the optimal dimensions of the test structures may not be the correct dose/focus combination to optimize the CD distribution of the patterns within the device die.

The lithography exposure tool's optical characteristics and the exact type of features being patterned both have a strong influence on CD performance when patterning advanced design rule integrated circuits. Of particular importance are the optical aberrations of the lithographic lens system as well as the systematic dose and focus errors across the field. Many examples exist today of methods used to quantitatively measure these optical aberrations. Three examples of these, each based on slightly different physical principles, are the Litel reticle concept, the Artemis concept by ASML, and the phase shift grating of Toshiba. In each case, the output of the analysis tool is typically provided in terms of Zernike polynomial coefficients, which can accurately describe the induced phase error across the exit pupil of the lithographic lens, and which can be easily interpreted in optically meaningful terms such as spherical, astigmatic, and coma aberrations. Furthermore, a Zernike polynomial description of the aberrations is required for each field point of interest. Although these aberration descriptors are generally accepted as quantitative metrics for the quality of lens systems, it is a non-trivial problem to quantitatively estimate the impact they will have on CD, or more specifically, on the specific dimensions of different types of features within the integrated circuit. Such calculations require detailed knowledge of other process parameters such as the exposure tool illumination configuration, partial coherence, the geometry of the pattern, and the response of the photoresist process to different aerial image profiles.

SUMMARY OF THE INVENTION

An embodiment of the invention relates to a computer-implemented method that includes determining errors across a field of a lens of a lithography system based on wafer measurements. The method also includes separating the errors into correctable and non-correctable errors across the field. The errors may include dose errors, focus errors, or dose and focus errors. Separating the errors into correctable and non-correctable errors may include fitting a linear model to the errors across the field to determine the correctable errors. The computer-implemented method may be performed by a computer coupled to a measurement device that performs the wafer measurements or by a computer that is not coupled to the measurement device.

In one embodiment, the wafer measurements may include one or more parameters of features printed on a wafer using the lithography system. The one or more parameters may be measured using a scatterometry technique. In such an embodiment, the one or more parameters may include critical dimension (CD), sidewall angle, resist thickness loss, or a combination thereof. In another embodiment, the wafer measurements may include at least one measurement within multiple fields printed on a wafer using the lithography system and multiple measurements within at least one field printed on the wafer. In some embodiments, the wafer measurements may include one or more parameters of both horizontal features and vertical features printed on a wafer using the lithography system. In one such embodiment, the method may include determining astigmatism errors in the lens using the errors. In yet another embodiment, the wafer measurements may include one or more parameters of features printed on a wafer using the lithography system. The features may have different dimensions, different pitches, or different dimensions and pitches. In this embodiment, the method may include determining low order aberrations in the lens using the errors.

In an embodiment, the method may also include determining one or more parameters of features that would be printed on a wafer using the lithography system if the correctable errors were eliminated. In another embodiment, the wafer measurements may include one or more parameters of a first feature type printed on a first wafer using the lithography system. In such an embodiment, the method may include determining one or more parameters of a second feature type different than the first feature type that would be printed on a second wafer using the lithography system if the correctable errors were eliminated.

In some embodiments, the method may include determining correction terms for one or more parameters of the lithography system. If the correction terms are applied to the one or more parameters, the correctable errors would be eliminated resulting in approximately optimal imaging performance of the lithography system. In addition, the method may include determining correction terms for one or more parameters of the lithography system as a function of position within the field.

In another embodiment, the method may include monitoring performance of the lens or the lithography system over time using the non-correctable errors. The method may also include generating one or more spatial maps of the non-correctable errors across the field. Such an embodiment of the method may also include monitoring a performance of the lens or the lithography system over time using the one or more spatial maps. In addition, the method may include determining one or more areas within the field at which performance of the lens is worse than other areas within the field. This method may also include altering one or more parameters of a measurement device used to measure wafers printed with the lithography system such that the one or more areas are more closely monitored than the other areas. The computer-implemented method may include any additional steps of any other methods described herein.

Another embodiment relates to a different computer-implemented method that includes controlling one or more parameters of features within substantially an entire printed area on a product wafer using a limited number of wafer measurements performed on a test wafer. The wafer measurements may be performed within an integrated circuit die or within a scribe line on the test wafer. In addition, the wafer measurements may be performed on a first feature type on the test wafer, and the features on the product wafer that are controlled may include a second feature type different than the first feature type.

In some embodiments, the method may include developing a tuned simulation model based on aberrations of a lens of a lithography system and parameters of a lithography process. In one such embodiment, the method may also include predicting one or more parameters of one or more feature types printed in a resist at one or more positions within a field of the lens using the wafer measurements, the tuned simulation model, and design data.

In another embodiment, the method may include comparing the wafer measurements to one or more predicted parameters of one or more feature types printed in a resist to determine exposure conditions applied to the test wafer. In addition, the method may include using a tuned simulation model with the exposure conditions and design data to predict one or more parameters of one or more feature types printed on the product wafer. Furthermore, the method may include determining if the one or more parameters of the one or more feature types pass or fail specifications for the one or more parameters of the one or more feature types.

In an additional embodiment, the wafer measurements may be performed using a scatterometry technique. The advantage of scatterometry is that it can be readily used to extract the focus error. However, the wafer measurements may be performed using a different technique. For example, some new SEM based approaches can perform the same measurements as scatterometry, i.e., extract profile information and infer dose and focus errors. Other SEM based measurements can extract focus and dose correctables using specialized targets or other techniques. In such an embodiment, the method may include determining exposure conditions (e.g., dose and focus conditions) applied to the test wafer based on the wafer measurements. In addition, the method may include using a tuned simulation model with the exposure conditions and design data to predict one or more parameters of one or more feature types printed on the product wafer.

In some embodiments, controlling the parameter(s) of the features may include applying exposure corrections (e.g., dose and focus corrections) to a lithography system that are fixed across a field printed on the product wafer by the lithography system. In other embodiments, controlling the parameter(s) of the features may include applying exposure corrections to a lithography system that vary from field to field printed on the product wafer by the lithography system. In yet other embodiments, controlling the parameter(s) of the features may include applying exposure corrections to a lithography system that vary across a field printed on the product wafer by the lithography system. The method may include additional steps described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

State of the art lenses cost millions of dollars, and replacing a lens may not be possible in the user's fabrication facility ("fab") thereby requiring that the entire exposure tool is shipped back to the supplier. Even if the lens can be replaced or adjusted in the fab, it will require the exposure tool to be out of production for an extended period of time, resulting in a serious financial loss for the user. It is, therefore, imperative that whatever method is used to qualify lens performance, the user must be able to unambiguously determine if the lens itself has actually degraded to the point where it is unusable for leading edge production.

The imaging performance of any optical system is critically dependent upon the material being exposed being at the correct focal point of the imaging system. For a large field lens, this means that not only does the mean focus position have to be set correctly, but also the imaging field must not be tilted in any way relative to the reticle plane. Even a small tilt can cause a large amount of critical dimension (CD) variation across the lens field. Since the CDs do not respond linearly with respect to focal position, it is not possible to look at the CD distribution and infer a focal plane error. Thus, the lens can be in spec, but the CD results can make it appear to be out of spec if there is any tilt or other focal plane error. Similarly, it is possible for the lens to be well within specification but appear to be out of spec due to small variations in exposure dose across the lens field. To determine if the lens performance is within spec or not, it is necessary to have a method that allows the exposure dose and focal plane error (or dose and focus errors) at each point in the field to be determined and that allows separation of the correctable and non-correctable components of the exposure dose and focal plane error (or dose and focus errors).

Therefore, a method is needed to unambiguously separate correctable from non-correctable exposure dose and focal plane errors (or dose and focus errors) across the lens field and to determine the imaging performance (e.g., CD uniformity) one can expect from the lens once the correctable terms are properly adjusted. The method should also be able to store maps of the non-correctable errors to determine if the shape of the focal plane surface (or dose and focus surfaces) is varying over time. The methods described herein may be used to meet these objectives.

Figure 1:
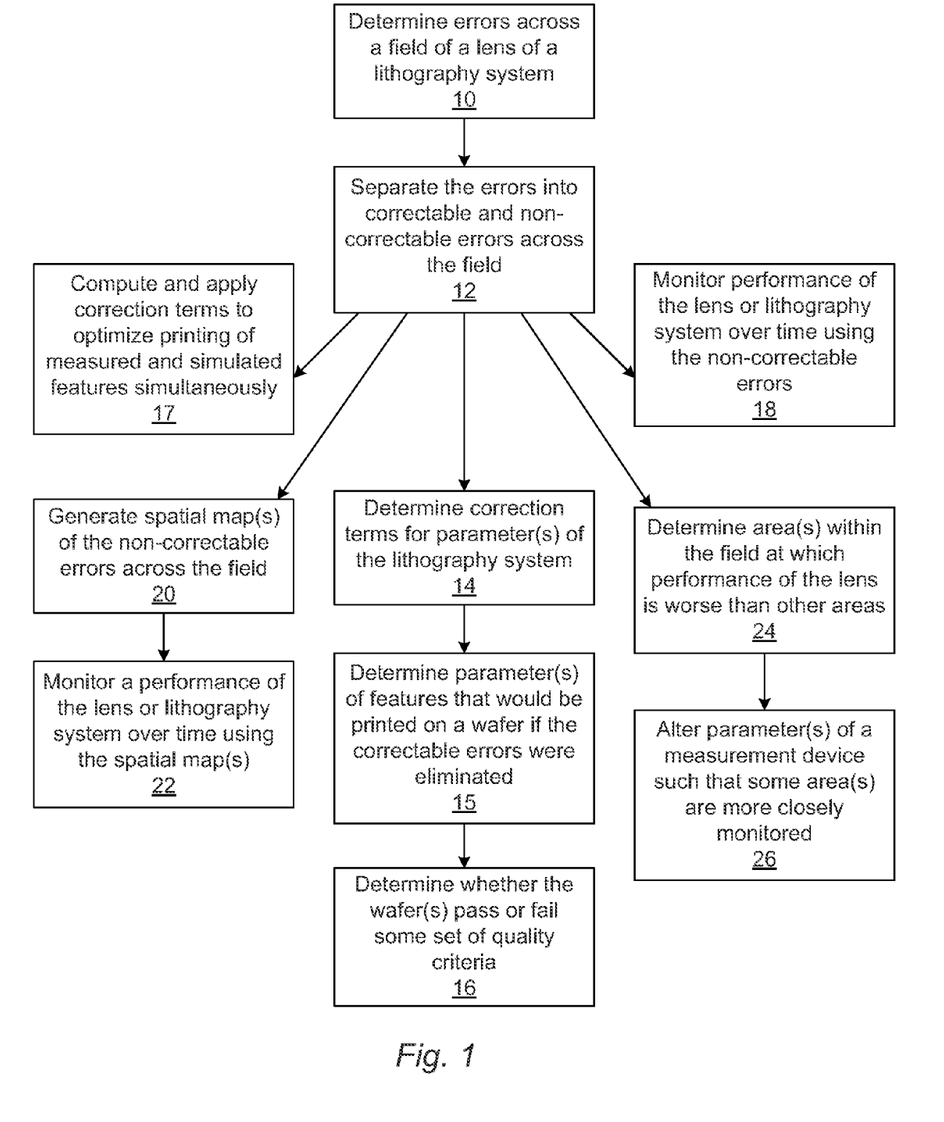
FIG. 1 is a flow chart illustrating one embodiment of a computer-implemented method.

Turning now to the drawings, FIG. 1 illustrates a new computer-implemented method for quantifying lens performance in lithographic exposure tools (steppers or scanners). It is noted that the steps shown in FIG. 1 are not essential to practice of the method. One or more steps may be omitted or added to the method illustrated in FIG. 1, and the method can still be practiced within the scope of this embodiment. The methods and algorithms described herein may be used to quantify not only the CDs (and/or other feature parameters) printed across the lens field, but also to determine the focal plane errors at each point in the field. The method shows how focal plane information can be extracted from the data, and how we can then separate correctable and non-correctable focal plane errors. Simulation can then be used to predict the residual CD error that would result if the correctable terms were reduced to zero. This method allows the user to determine and track the ultimate lens performance that could be achieved under ideal conditions. Other uses of the focal plane information will also be discussed in detail.

This method can be extended to compute the exposure dose errors as well as defocus errors at each point in the field. Exposure correctable terms can be computed as well as focus corrections, and CDs or other feature parameters can be simulated in the absence of both the dose and focus correctable errors. Maps of the exposure non-correctable errors can be computed in the same way as focus errors and used to monitor exposure tool stability as well.

As used herein, the term "errors" is used to refer to dose errors, focus errors, or dose and focus errors. In the following description, the terms "focus error" and "defocus" are used interchangeably. In addition, the terms "dose error," "exposure error," and "exposure dose error" are used interchangeably. In addition, although certain embodiments are described with respect to focus errors, correctable and non-correctable focus errors, and spatial maps of focus errors or non-correctable focus errors, it is to be understood that the embodiments are equally applicable to exposure dose errors, corrections, and spatial maps. In addition, the term "exposure conditions" refers to all of the conditions that apply to the exposure of a wafer, such as the exposure dose and the position of the focal plane, and "exposure corrections" refers to changes made to the exposure conditions, such as changes in exposure dose and focus settings. Furthermore, although certain embodiments are described with respect to CD, it is to be understood that the methods described herein equally apply to other feature parameters such as side wall angle.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

A wafer may include only the substrate such as a virgin wafer. Alternatively, a wafer may include one or more layers formed upon a substrate. For example, such layers may include, but are not limited to, a resist, a dielectric material, and a conductive material. A resist may include any material that may be patterned by an optical lithography technique, an e-beam lithography technique, or an X-ray lithography technique. Examples of a dielectric material may include, but are not limited to, silicon dioxide, silicon nitride, silicon oxynitride, and titanium nitride. Additional examples of a dielectric material include "low-k" dielectric materials such as Black Diamond™ which is commercially available from Applied Materials, Inc., Santa Clara, Calif., and CORAL™ commercially available from Novellus Systems, Inc., San Jose, Calif., "ultra-low k" dielectric materials such as "xerogels," and "high-k" dielectric materials such as tantalum pentoxide. In addition, examples of a conductive material include, but are not limited to, aluminum, polysilicon, and copper.

One or more layers formed on a wafer may be patterned or unpatterned. For example, a wafer may include a plurality of dies having repeatable pattern features. Formation and processing of such layers of material may ultimately result in completed semiconductor devices. As such, a wafer may include a substrate on which not all layers of a complete semiconductor device have been formed or a substrate on which all layers of a complete semiconductor device have been formed. The term "semiconductor device" is used interchangeably herein with the term "integrated circuit." In addition, other devices such as microelectromechanical (MEMS) devices and the like may also be formed on a wafer.

As used herein, the term "lithography system" is used to generally refer to any lithography system that prints images of a reticle onto a wafer using light. The lithography system may be a scanning projection system or a step and scan system, which are both commonly referred to as a "scanner" or a step-and-repeat system, also called a "stepper." The lithography system may include any exposure system known in the art such as systems commercially available from Nikon, ASM Lithography, Canon, SVG Lithography, or Integrated Solutions, Inc. The terms "lithography system," "scanner," and "stepper" are used interchangeably herein.

As shown in step 10, the method includes determining errors across a field of a lens of a lithography system based on wafer measurements. The wafer measurements may include one or more parameters of features printed on a wafer using the lithography system. The one or more parameters may be measured using a scatterometry technique. For example, the proposed solution may be based on extraction of the focus error at each position based on scatterometry data, which can measure not only the CD, but also the resist sidewall angle (SWA) and resist thickness loss (RL) at every measurement location. One example of a scatterometry based CD (SCD) measurement tool that can perform such measurements is the SpectraCD system commercially available from KLA-Tencor. However, the wafer measurements may be performed using any other type of measurement tools that can measure such parameters of features on a wafer such as Focus Exposure Line Monitor (FELM) tools, which can provide a clear indication of the local focal plane performance, but SCD has the advantage of providing both focus information and a specific CD measurement.

The wafer measurements may also be performed using a SEM based approach that analyzes the 3D shape of the resist profile. Examples of methods for developing a virtual three-dimensional representation of a photoresist feature are illustrated in U.S. Pat. No. 6,651,226 to Houge et al., which is incorporated by reference as if fully set forth herein. The SEM approaches can either grab multiple images at small tilt angles to infer the shape, or do a signal analysis of the shape of the scattered electron profile. In the case of tilt, it is usually done by electronically tilting the beam, not physically tilting the sample. This tilting ability is what makes the SEM based approaches useful since electronic tilt can be done in milliseconds. Such tilt capability is available on several commercially available SEM based systems such as those available from Applied Materials and KLA-Tencor.

The wafer measurements may be performed at multiple points across at least one lens field printed on a wafer using the lithography system. For example, four or more points may be measured in at least one field printed on the wafer. Multiple fields may also be measured and averaged to reduce the effects of process or wafer chucking errors. In one example, four or more fields may be measured at one or more measurement points in each field. The measured wafers may be monitor wafers or product wafers. In addition, multiple fields on the measured wafers may be printed with different focus and exposure doses in a matrix (i.e., a FEM wafer) or with the same focus and exposure dose in each field. Interfield corrections may also be applied to reduce or eliminate the effect of global wafer tilt or curvature. The data may be automatically analyzed on the measurement tool and values of CD, SWA, and RL may be calculated for individual measurement points. These results may be passed to an analysis program either embedded on the same tool or on an off-line workstation. In this manner, the computer-implemented methods described herein may be performed by a computer coupled to a measurement device that performs the wafer measurements or by a computer that is not coupled to the measurement device.

Dose and focus errors may then be determined on a point-by-point basis. For example, as described in U.S. Pat. No. 7,382,447 to Mieher et al., which is incorporated by reference as if fully set forth herein, a response surface model can be created relating the measured CD, SWA, and RL to the dose and focus error during exposure. When a feature is measured, an error function is computed relating the observed values of CD, SWA, and RL to the modeled response surfaces for all three parameters. The combination of dose and focus conditions which minimize the total error function for the three parameters simultaneously provides the best estimate of the dose and focus errors at the measured points. Using this approach, we can map out the focal plane errors across the lens field. Knowing the focal plane errors across the lens field, simulation or look up tables may be used to predict what CD error (or error in another feature parameter) can be expected on other features or wafers due to the local focal plane errors. In an alternative, the average focus error per field may be determined. In addition, the method may include correcting and averaging fields together or averaging the fields together but correcting the fields separately.

This process can be repeated for both horizontal and vertical structures to determine the astigmatism errors as a function of location within the field as well. For example, the wafer measurements may include one or more parameters of horizontal features and vertical features printed on a wafer using the lithography system. The astigmatism errors in the lens may be determined using the errors. In addition, one or more parameters of features printed on a wafer by the lithography system that have different dimensions (or CDs) and/or different pitches can be measured to ensure that the inferred focus error is not being unduly influenced by other Zernike aberrations. In addition, features having different CDs and/or pitches may be measured to allow the determination of low order aberrations in the lens.

The method also includes separating the errors into correctable and non-correctable errors across the field, as shown in step 12. Once the focal plane and dose deviations are known across the lens field, in this step, a linear model, for example, may be fitted to the data to determine the correctable errors. This model can extract the average focus error in the z-direction (out of plane offset) and the tilt about the x and y axes (in plane tilts). Similarly, a spatial map may be fitted to the exposure and defocus errors to determine correctable errors in both exposure and focus, which are typically linear errors, but some non-linear terms are also correctable depending on the stepper or scanner adjustments available to the user. For example, one can map out the correctable exposure dose errors, either as a global offset, separate x- and y-offsets (scanner systems), a radial map across the field (steppers) or a combination of the above. Knowing the correctable errors, we can then predict what the residual focal plane error (or dose and focus errors) would be across the imaging field (non-correctable errors). Therefore, the method uses extracted errors (focus, dose, or dose and focus errors) to separate correctable and non-correctable terms from measured CD data.

The method may also include determining correction terms for one or more parameters of the lithography system as a function of position within the lens field, as shown in optional step 14. The correction terms may be modeled across the lens field using the dose and/or focus errors. In addition, correction terms for one or more parameters of the lithography system may be determined such that if the correction terms are applied to the one or more parameters the correctable errors would be eliminated thereby resulting in approximately optimal imaging performance of the lithography system.

In a further embodiment, as shown in optional step 15, the method may include determining one or more parameters of features that would be printed on a wafer using the lithography system if the correctable errors were eliminated. Therefore, the method may use the extracted errors to simulate the ultimate imaging capability that would have been achieved had the correctable errors not been present. For example, simulation can then be applied to predict the expected CD at each point in the lens field if the only focal plane errors (or dose and focal plane errors) were the non-correctable terms, i.e., assuming perfect compensation of the correctable terms. The corrected CDs, assuming that the corrections were applied properly, could be modeled with KLA-Tencor's PROLITH lithography simulation software called automatically.

Alternatively, a calibrated empirical model such as those generated by KLA-Tencor's ProDATA software could be used. The results could be displayed automatically on the user's computer screen and reported via the fab automation system to whatever statistical process control (SPC) or advanced process control (APC) system is in use to monitor tool performance. The entire procedure can be done by manually moving files and invoking separate software programs. However, it would clearly be most advantageous to the user if the method were implemented as a single "no keystroke" operation invoked automatically by the measurement tool upon completion of the measurement recipe. Alternatively, look up tables may be used to calculate the CD that would have been obtained in the absence of the correctable errors terms. This prediction of the CD distribution is then a best case estimate of the ultimate imaging capability of the system under test. The method may further include determining whether the wafer(s) will pass or fail some set of quality criteria, as shown in optional step 16. The quality criteria may include any criteria known in the art such as CD distribution.

In addition, the method may include computing and applying correction terms to optimize the printing of one or more measured and simulated features (or even all measured and simulated features) simultaneously, as shown in optional step 17. For example, the wafer measurements may include one or more parameters of a first feature type printed on a first wafer using the lithography system. The method may also include determining one or more parameters of a second feature type, which is different than the first feature type, that would be printed on a second wafer using the lithography system if the correctable errors were eliminated. In other words, knowing the dose or dose and focus errors at one or more measurement points, the expected CDs (or other parameters) for feature types other than those that were actually measured may be determined to predict how they would have printed. Therefore, the methods described herein use extracted error terms, both correctable and non-correctable, to simulate the expected printing of different feature types that were not actually measured thereby providing more data to the user than could be measured in the available time.

Figure 2:
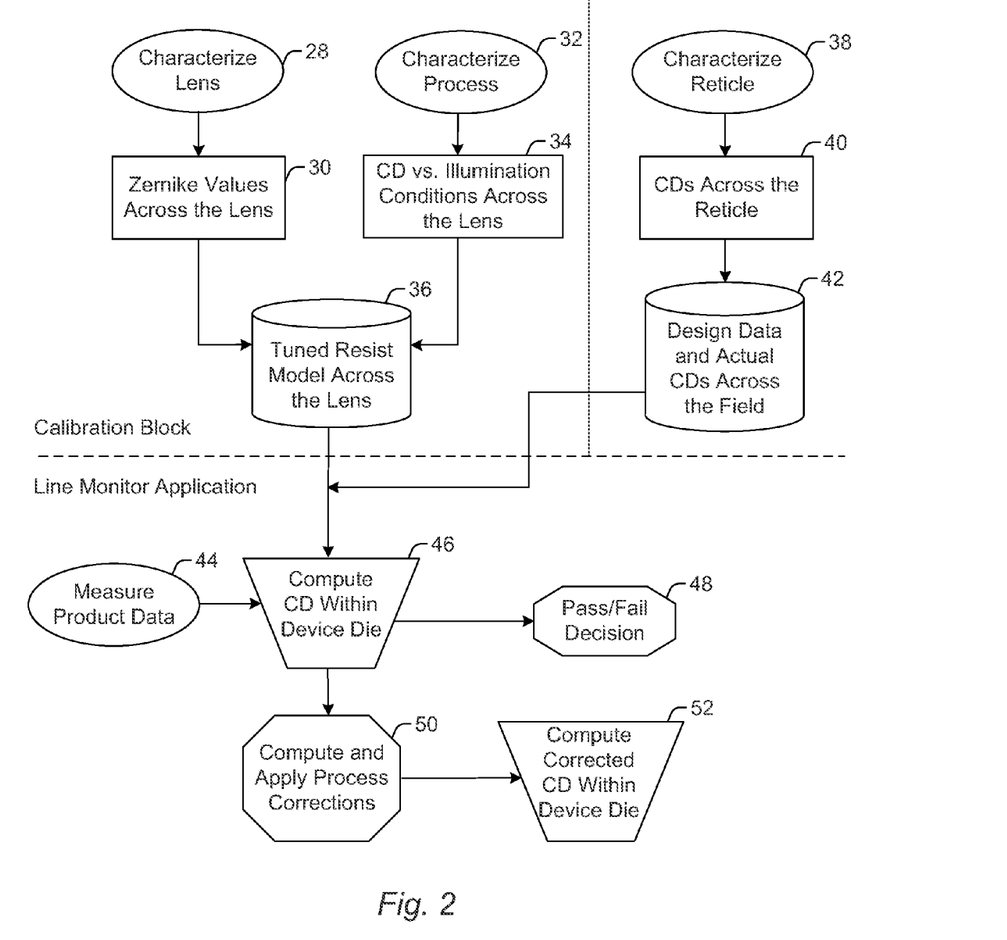
FIG. 2 is a flow chart illustrating another embodiment of a computer-implemented method.

Not only can we predict how different feature types would have printed, but we can use the extracted error terms to compute correction terms to optimize the printing of one or more different feature types. Instead of the typical approach used now (e.g., measure feature type 1 at a set of locations, compute corrections to optimize the printing of those specific features), our approach is to measure feature type 1 at a first set of locations, compute feature type 2 at a second set of locations (and also type 1 at the second set of locations), then compute corrections to optimize the printing of all of these features. One computer-implemented method that can be used to perform such computations is illustrated in FIG. 2, which is described in detail below. Optional steps 15 and 16 as described above may also be performed after step 17 for both measured and simulated features.

The method may also include monitoring performance of the lens or lithography system over time using the non-correctable errors, as shown in optional step 18. In one embodiment, the method may also include generating one or more spatial maps of the non-correctable errors across the field, as shown in optional step 20. The maps may be computed for non-correctable focus and/or exposure errors (NCEs). Alternatively, or in addition, spatial maps indicating the expected lens performance if the correctable errors were eliminated may be generated. The spatial maps may also be used to indicate different types of errors or aberrations in the lens over time, i.e., how many nanometers of astigmatism in the worst location of the lens or in various locations on the lens, how many nanometers of variation due to the radial effects across the lens, etc.

In addition, the method may include monitoring a performance of the lens or lithography system over time using the spatial map(s), as shown in optional step 22. For example, the maps of the NCEs may be compared to stored maps on a point-by-point basis to identify points or regions of the lens field where unacceptable drifts have occurred over time.

Stored maps may be "golden images," initial acceptance data, or time weighted averages of previous maps computed using standard SPC or APC techniques. Therefore, spatial maps of the non-correctable errors across the field may be used as a means for monitoring lens or lithography system performance and detecting early signs of drift or abrupt changes that would impair lithography tool performance.

In addition, plots of multiple parameters of lens quality, not just CD range and astigmatism, could be maintained over time to track lens performance. The multiple parameters used to track lens quality or performance may include, but are not limited to, range of focal plane deviation (FPD), $2^{nd}$ order (or high order) fit to residual FPD (shape of FPD signature), fitting parameters describing shape of residual CD errors, and maximum error at the worst location in lens field. If the location with the worst CD or FPD errors were to change over time, this method could catch such changes on a point-by-point basis and alert the user. Additional parameters that may be used to track lens quality or performance may include the range of residual CD errors after correctable focal plane errors are removed (both horizontal and vertical), astigmatism (maximum, range, location of worst errors, etc.), and suggested focus offset to minimize impact of astigmatism across the full field (compromise best focus setting to get tightest total CD distribution)

As shown in optional step 24, the method may include determining one or more areas within the lens field at which performance of the lens is worse than other areas within the field. In addition, the method may include altering one or more parameters of a measurement device used to measure wafers printed with the lithography system such that the one or more areas are more closely monitored than other areas, as shown in optional step 26. For example, as described above, knowing the focal plane performance for multiple CDs and pitches, a simple model may be developed to predict CD performance of a wide range of CDs and pitches not actually measured in the lens qualification itself. Offsets between best focus for different CDs and/or pitches could be plotted to indicate positions in the lens field having the worst performance vs. feature type and used to monitor those areas more closely. Therefore, when a problem area or potential problem areas are detected in a lens, the measurement device may be directed to measure parameters of features in these problem areas more frequently or at more locations. In this manner, if the problem or potential problem areas fall out of spec, the methods described herein may detect the out of spec problem sooner than other monitoring methods.

The method may also include generating output indicating the results of the method such as a report to the user or data sent to a fab database. The output may include, but is obviously not limited to, the range of corrected and non-corrected CD values, computed focus and/or exposure correctable terms for correction based on standard SPC or APC techniques, NCE maps, range of non-correctable focus and/or exposure variation across the field for SPC/APC tracking, and determination of unacceptable drift or abrupt change.

The methods described above provides substantial improvements over the current methods for lens monitoring. By separating out the correctable errors (focus, dose, or focus and dose errors), the method supplies the user with several key parameters that were not previously available without extensive additional testing. These key parameters include: correction terms to optimize exposure conditions, true best imaging performance to be expected if the computed corrections were properly applied, drifts or discontinuities in the correction terms over time, and drifts or discontinuities in the non-correctable errors over time, providing early warning of changes in system performance before they become a major problem. In addition, the computed errors (focus, dose, or focus and dose errors) can be used as inputs to simulation to predict how multiple feature types would have printed under the same conditions. This simulation can allow the user to quickly and automatically simulate the printing of many more features than could reasonably be measured in the time typically available for system monitoring and to compute improved correction terms to optimize the printing of all of these features. The value of these key parameters to the end user is in allowing better correction, which can amount to millions of dollars per year in improved yield and tighter electrical device performance.

As described further above, FIG. 1 illustrates a computer-implemented method for quantifying lens performance in lithographic exposure tools. Further description provided herein relates to a different computer-implemented method. It is to be understood that, in one embodiment, the two computer-implemented methods may be performed or used separately, independent of one another. However, in an alternative embodiment, the two computer-implemented methods may also be used together or combined into a single computer-implemented method. For example, in one embodiment, the results of the computer-implemented method of FIG. 1 may be used as input for the other computer-implemented method.

A method is also needed to allow the CDs (or other feature parameters) everywhere within an array of integrated circuits printed on a wafer to be accurately predicted and controlled based on a limited number of measurements in production. The method described below uses a combination of extensive off-line characterization of the lens aberrations coupled with a tuned simulation model to accurately predict the CDs for any type of feature anywhere within the printed field. The method also makes use of predicted CDs for specific features or predicted CD distributions within a device based on limited metrology data coupled with a tuned or empirical pattern transfer model in order to disposition wafers and/or make process corrections. One embodiment of such a method is illustrated in FIG. 2. It is noted that the steps shown in FIG. 2 are not essential to practice of the method. One or more steps may be omitted or added to the method illustrated in FIG. 2, and the method can still be practiced within the scope of this embodiment.

FIG. 2 is a block diagram illustrating one embodiment of a computer-implemented method that includes controlling one or more parameters of features within substantially an entire printed area on a product wafer using a limited number of wafer measurements performed on a test wafer. The method includes calibration steps performed off-line to characterize the lens aberrations, reticle CD distribution, and wafer process, and to develop a tuned simulation model to predict the resist performance for any type of feature anywhere within the field (as shown in the "Calibration Block") and line monitoring (as shown in the "Line Monitor Application") in which a limited number of points is measured on the product wafers, compared to tuned simulation model predictions, then combined with the known layout of the device being printed and the tuned simulation model to predict the CDs of multiple critical features within the die. The line monitor use case can either be 1) a simple pass/fail decision, 2) a process correction using a combination of dose and focus corrections which are fixed across the lens field, or 3) a process correction using dose and focus corrections which vary across the field, both along the scan slit and along the scan direction.

As shown in step 28, the "Calibration Block" includes characterizing a lens of a lithography system. The lens may be characterized using the method shown in FIG. 1. In addition, or alternatively, characterizing the lens may include determining Zernike values across the lens, as shown in step 30. The determination of the lens aberration parameters ("Zernikes") can be done by any of a number of methods, or they may be provided by the lens manufacturer. As shown in step 32, the method also includes characterizing a lithography process. Characterizing the process may include determining feature parameters by typical CD metrology tools, either CD-scanning electron microscopes (CD-SEMs), cross-sectional SEMs, profile measuring tools, or scatterometry based measurement systems such as those described above. Characterizing the process may include determining CD (or other feature parameters) vs. illumination conditions across the lens, as shown in step 34. The parameters of the lithography process may also include process data for different feature sizes and types through focus and exposure.

Using the combination of the parameters of the lithography process and the lens aberrations, a tuned simulation model across the lens may be developed, as shown in step 36. The simulation model can be tuned to give accurate predictions of many different feature types as a function of lens position (Zernike aberrations), illumination conditions (focus, exposure, numerical aperture, and partial coherence), and reticle errors (either measured, assuming a model of the reticle process, or using a simulation of the mask making process). As shown in optional steps 38, 40, and 42, the method may include characterizing the reticle, which may include determining CDs of features across the reticle, and using design data with the determined CDs across the reticle to determine the actual CDs across the lens field. The model can also include the use of phase shifting or optical proximity correction techniques.

In an alternative embodiment, the tuned simulation model may be replaced by an empirical lookup table for specific pattern geometries or by experimental calibration data collected on non-product wafers. Such an alternative may be necessary in cases where the process conditions are too new or too complex for a sufficiently accurate model to be available, such as new photoresist chemistries with unknown reaction mechanisms, multi-layer resist processes involving both wet develop and dry etch steps, or new processes involving dry deposition and etching of advanced photosensitive materials.

Once the calibration phase is complete, the Line Monitor Application may be performed, which includes measuring product data, as shown in step 44. The measured data may include a limited number of wafer measurements performed on a test wafer. The test wafer is preferably a product wafer, but may also be a monitor wafer. The method uses data from metrology targets printed at a limited number of locations, either within the integrated circuit itself (die) or within one or more scribe lines between the die. As shown in step 46, the method includes predicting a large number of device CDs (or other feature parameters) within the die and across the wafer using the limited number of test sites measured, the tuned resist model, and the known layout of the device being printed (design data). Design data generally includes data on the types of structures in the device and their locations, which may be obtained from a design data file that can be imported in any of a number of standard formats. In other words, the wafer measurements, the tuned simulation model, and the design data may be used to predict one or more parameters of one or more feature types printed in a resist at one or more positions within a field of a lens or across a wafer.

In particular, the measured CD data is analyzed to predict the conditions of focus and exposure applied to the test wafer. For example, information about the exposure conditions can be extracted from wafer measurements performed using a scatterometry technique or scatterometry based metrology tool as described above. Alternatively, information about exposure conditions can be determined by least squares analysis of the measured data compared to the tuned model predictions. In this manner, the wafer measurements may be compared to one or more predicted parameters of one or more feature types printed in a resist to determine exposure conditions applied to the test wafer. Once the focus and exposure conditions at the test sites have been determined, the tuned simulation model is then used with the exposure conditions and design data to predict one or more parameters of one or more feature types to be printed on a product wafer or however many structures are desired within the device die.

The wafer measurements may also be performed on a first feature type on the test wafer, and the features on the product wafer that are controlled may include one or more other feature types different than the first. For example, wafer measurements of a limited number of feature types may used to simulate one or more parameters of any feature types in a device die as described above. In this manner, a limited number of measurements of a limited number of feature types may be used to determine parameter(s) of any feature type in a device die.

The method may also include determining if the one or more parameters of the one or more feature types such as the device CDs or other feature parameters pass or fail specifications for the parameter(s), as shown in step 48. If the CDs or other parameters pass the specifications, the product wafers may be printed with the focus and exposure conditions determined above. Alternatively, the method may include determining process corrections that will bring the device CDs or other parameters into specification or closer to a target value for the CDs or other parameters, as shown in step 50. Step 50 may also include applying the process corrections. Therefore, the method further allows for controlling the CD of multiple types of device features within the die without requiring a corresponding increase in the number of measured points. Such an embodiment of the method may also include determining corrected CD within a device die that will be printed using the corrected process, as shown in step 52. The process corrections and corrected CDs within the device may be determined as described in FIG. 1. For example, the corrected CD within the device may be determined using simulation or a lookup table.

In some embodiments, the design data of specific CD information as a function of position within the die may be approximated by a coarse grid of data points with representative features within different regions of the device. In some other cases, the exact device design may not be available, or it may be difficult to prepare the model tables for each design (as, for example, in a foundry, where dozens of new designs are introduced into production every week). In a fab with a large number of exposure tools which may be used on any layer or design interchangeably, it may be difficult to maintain exact tables of Zernikes for each tool to be used in the model prediction. In these cases, sample distributions may be used instead, varying the Zernike aberrations and device geometries over a set range of conditions and predicting the range of CD errors to be expected based on the measured metrology test structures. While not as accurate as the point-by-point prediction capability, the simulated CD range is still a superior pass/fail or adjustment criteria than the current limited CD measurements.

Additional data may also be supplied from other sources to refine the predictions of CDs across the wafer. Data from the exposure tool may be used to describe the focus variations across the wafer, or films data from stand alone measurements or a scatterometer may be used to map out reflectivity variations across the wafer. Self-metrology data from the resist coat/develop track may also be input into the model to account for variations across the wafer in the various bake temperatures. The tuned simulation model can use this data to refine the predicted CD values across the wafer.

The method described above will allow a user to control a lithography process more accurately thereby increasing device yield and improving device electrical performance. In particular, the value to the end user can amount to millions of dollars per year in improved yield and tighter electrical device performance. For example, the method described above is a great improvement over the current art. Today, users make pass/fail decisions or compute corrections to the stepper exposure conditions based only on limited CD data for one type of feature at a very limited number of points across the lens field and across the wafer. Typical sampling plans, even for leading edge fabrication, use only two different structures at two points in the lens field at 5 to 10 fields across the wafer.

Some improvements in the art have been suggested in, for example, U.S. Pat. No. 6,248,485 to Cuthbert, which is incorporated by reference as if fully set forth herein, but even this improvement is fairly primitive, using the known variation of the lens field for a given feature type, but failing to account for the different distributions of feature types across the device die. CDs are affected by the interaction of lens aberrations as a function of position with feature type. The proposed method fully characterizes these two sources of variation independently, then combines the known variations in exposure tool performance with a tuned model of resist patterning as a function of both aberrations and device geometry to accurately predict the CDs across the entire device, and even across the entire wafer. Pass/fail decisions or stepper exposure corrections can then be made to optimize the entire CD distribution, not just CDs of the measured test structures.

The deficiencies in the current art become increasingly apparent as companies move to system on chip (SOC) approaches, where a single chip design may contain numerous different functional elements with significant variation in device geometries across a single die. Unlike previous generations of technology where a given device would be primarily of one type of structure (memory or random logic, for example), the increasingly complex designs in today's devices require multiple types of features to all function perfectly within a single die.

The problem becomes even more apparent as users adopt optical proximity correction (OPC) techniques to shrink feature sizes. OPC must be carefully tuned for the specific process conditions and lens performance, and are extremely sensitive to the exact CD and pitch of the geometry. It is not possible to include test structures in the scribe line or to measure enough points within the die to insure that all of the proximity corrections are applied correctly. A model based approach must be used to take a limited amount of data and extrapolate to predict whether or not all of the required geometries are adequately transferred through the lithography process. The methods described herein satisfy the requirements of these leading edge processes and devices.

The methods described herein can be extended to advanced control algorithms using design data which relates final electrical performance of the devices to the CDs of different structures within the device. Instead of tuning the exposure conditions to obtain the best CD values for the scribe line test structures, the methods described herein would allow the exposure conditions to be tuned for the optimum CD values of the most critical features, resulting in higher yield of the fastest, highest value devices.

In addition to dose/focus corrections, the numerical aperture of the projection lens (NA) and the partial coherence of the illumination system (sigma) can be adjusted to correct the CDs of different types of features. For example, while a simple increase in the dose would make both isolated lines and dense lines print smaller, an adjustment of the dose and the stepper NA and sigma could be computed based on the tuned resist model to change the CDs of the isolated structures, while leaving the CDs of the dense features unchanged thereby changing the offset between dense and isolated lines. We refer to the adjustment of any of these parameters (dose, focus, NA, sigma) based on model predictions as "model based process corrections."

The proposed model based process corrections can be made in one of several ways. For example, the exposure parameters can be adjusted once on a global basis (i.e., a single correction applied equally to all fields across the wafer and across the field) to shift the entire CD distribution. In another example, the exposure parameters can be adjusted differently for different fields across the wafer to optimize the CD distribution within each field on the wafer. In a further example, the exposure parameters can be adjusted across the field to optimize the CDs within each area of the device die. These changes can be made for either a stepper type of exposure tool where the entire field is imaged at the same time, or a scanner type of exposure tool where the field is exposed by a slit which is dynamically scanned across the exposure field. (NA and sigma cannot be changed across the field on a stepper. They might be adjustable across the field of a scanner, albeit with some difficulty.) Therefore, the exposure corrections applied to a lithography system may be fixed across a field printed on a product wafer by the lithography system, may vary from field to field printed on the product wafer, or may vary across a field printed on the product wafer.

It is to be understood that above-described approach can also be applied to the manufacture of reticles and photomasks, using a tuned model of the reticle manufacturing process (either electron beam written or optically written) and limited CD measurements across the mask to predict the CD performance everywhere on the mask in order to qualify the reticle and/or compute process corrections in the mask manufacturing process. The above-described approach may also be applied to maskless lithography, where the wafer is printed with an array of writing probes. The tuned model and predicted CDs can be used to compute correction factors for each independent writing element in the array. The simulation model can also be tuned to predict two dimensional metrics of pattern quality in addition to simple one dimensional CDs. These metrics can include, but are not limited to, line end shortening, corner rounding, contact hole area, inner and outer radii on elbow type structures, and the overlapping area between structures in the current layer and structures in a previously patterned layer. It is also to be understood that the methods shown in FIGS. 1 and 2 may be combined into a single computer-implemented method having various functions described above.

Program instructions implementing methods such as those described herein may be transmitted over or stored on a carrier medium. The carrier medium may be a transmission medium such as a wire, cable, or wireless transmission link. The carrier medium may also be a storage medium such as a read-only memory, a random access memory, a magnetic or optical disk, or a magnetic tape.

In an embodiment, a processor may be configured to execute the program instructions to perform a computer-implemented method according to the above embodiments. The processor may take various forms, including a personal computer system, mainframe computer system, workstation, network appliance, Internet appliance, personal digital assistant ("PDA"), television system or other device. In general, the term "computer system" may be broadly defined to encompass any device having one or more processors, which executes instructions from a memory medium.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

Further modifications and alternative embodiments of various aspects of the invention may be apparent to those skilled in the art in view of this description. For example, methods for improved monitor and control of lithography processes are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method, comprising:
   controlling one or more parameters of features within an entire printed area on a product wafer using a limited number of wafer measurements performed on the product wafer or another wafer, wherein the wafer measurements comprise one or more parameters of horizontal features and vertical features printed on the product wafer or the other wafer using a lithoaraphy system;
   determining exposure conditions applied to the product wafer or the other wafer based on the wafer measurements;
   predicting one or more parameters of one or more feature types printed on the product wafer using a tuned simulation model with the exposure conditions and design data for the product wafer, wherein the one or more feature types comprise at least one feature type on which the wafer measurements were not performed;
   determining errors in performance of a lens of the lithography system across a field of the lens based on the wafer measurements and separating the errors into correctable and non-correctable errors across the field, wherein the errors comprise dose errors, focus errors, or dose and focus errors; and
   determining astigmatism errors in the lens using the errors, wherein said controlling, said determining the exposure conditions, said predicting, said determining the errors, and said determining the astigmatism errors are performed by a computer having one or more processors executing instructions from a memory medium.

2. The method of claim 1, wherein the wafer measurements are performed within an integrated circuit die or within a scribe line on the product wafer or the other wafer.

3. The method of claim 1, wherein the wafer measurements are performed on a first feature type on the product wafer or the other wafer, and wherein the features on the product wafer that are controlled comprise a second feature type different than the first feature type.

4. The method of claim 1, further comprising developing the tuned simulation model based on aberrations of the lens of the lithography system and parameters of a lithography process.

5. The method of claim 4, wherein said predicting comprises predicting the one or more parameters of the one or more feature types printed in a resist at one or more positions within a field of the lens using the wafer measurements, the tuned simulation model, and the design data.

6. The method of claim 1, wherein said determining the exposure conditions comprises comparing the wafer measurements to one or more predicted parameters of one or more feature types, of the features on which the wafer measurements were performed, printed in a resist to determine the exposure conditions applied to the product wafer or the other wafer.

7. The method of claim 1, further comprising determining if the one or more parameters of the one or more feature types pass or fail specifications for the one or more parameters of the one or more feature types.

8. The method of claim 1, wherein the wafer measurements are performed using a scatterometry technique.

9. The method of claim 1, wherein said controlling comprises applying exposure corrections to the lithography system that are fixed across a field printed on the product wafer by the lithography system.

10. The method of claim 1, wherein said controlling comprises applying exposure corrections to the lithography system that vary from field to field printed on the product wafer by the lithography system.

11. The method of claim 1, wherein said controlling comprises applying exposure corrections to the lithography system that vary across a field printed on the product wafer by the lithography system.

12. The method of claim 1, wherein the features have different dimensions, different pitches, or different dimensions and pitches, the method further comprising determining low order aberrations in the lens using the errors.

13. The method of claim 1, further comprising determining correction terms for one or more parameters of the lithography system as a function of position within the field.

14. A non-transitory computer-readable medium, comprising program instructions executable on a processor to perform a computer-implemented method, wherein the computer-implemented method comprises:
   controlling one or more parameters of features within an entire printed area on a product wafer using a limited number of wafer measurements performed on the product wafer or another wafer, wherein the wafer measurements comprise one or more parameters of horizontal features and vertical features printed on the product wafer or the other wafer using a lithography system;
   determining exposure conditions applied to the product wafer or the other wafer based on the wafer measurements;
   predicting one or more parameters of one or more feature types printed on the product wafer using a tuned simulation model with the exposure conditions and design data for the product wafer, wherein the one or more feature types comprise at least one feature type on which the wafer measurements were not performed;

determining errors in performance of a lens of the lithography system across a field of the lens based on the wafer measurements and separating the errors into correctable and non-correctable errors across the field, wherein the errors comprise dose errors, focus errors, or dose and focus errors; and determining astigmatism errors in the lens using the errors.

15. A system, comprising: a measurement device configured to perform wafer measurements; and a computer configured for:

controlling one or more parameters of features within an entire printed area on a product wafer using a limited number of the wafer measurements performed on the product wafer or another wafer, wherein the wafer measurements comprise one or more parameters of horizontal features and vertical features printed on the product wafer or the other wafer using a lithography system;

determining exposure conditions applied to the product wafer or the other wafer based on the wafer measurements;

predicting one or more parameters of one or more feature types printed on the product wafer using a tuned simulation model with the exposure conditions and design data for the product wafer, wherein the one or more feature types comprise at least one feature type on which the wafer measurements were not performed;

determining errors in performance of a lens of the lithography system across a field of the lens based on the wafer measurements and separating the errors into correctable and non-correctable errors across the field, wherein the errors comprise dose errors, focus errors, or dose and focus errors; and determining astigmatism errors in the lens using the errors, wherein the computer has one or more processors executing instructions from a memory medium.

16. The system of claim 15, wherein the wafer measurements are performed within an integrated circuit die or within a scribe line on the product wafer or the other wafer.

17. The system of claim 15, wherein the wafer measurements are performed on a first feature type on the product wafer or the other wafer, and wherein the features on the product wafer that are controlled comprise a second feature type different than the first feature type.

18. The system of claim 15, wherein the computer is further configured for developing the tuned simulation model based on aberrations of the lens of the lithography system and parameters of a lithography process.

19. The system of claim 18, wherein said predicting comprises predicting the one or more parameters of the one or more feature types printed in a resist at one or more positions within a field of the lens using the wafer measurements, the tuned simulation model, and the design data.

20. The system of claim 15, wherein said determining the exposure conditions comprises comparing the wafer measurements to one or more predicted parameters of one or more feature types, of the features on which the wafer measurements were performed, printed in a resist to determine the exposure conditions applied to the product wafer or the other wafer.

21. The system of claim 15, wherein the computer is further configured for determining if the one or more parameters of the one or more feature types pass or fail specifications for the one or more parameters of the one or more feature types.

22. The system of claim 15, wherein the wafer measurements are performed using a scatterometry technique.

23. The system of claim 15, wherein said controlling comprises applying exposure corrections to the lithography system that are fixed across a field printed on the product wafer by the lithography system.

24. The system of claim 15, wherein said controlling comprises applying exposure corrections to the lithography system that vary from field to field printed on the product wafer by the lithography system.

25. The system of claim 15, wherein said controlling comprises applying exposure corrections to the lithography system that vary across a field printed on the product wafer by the lithography system.

26. The system of claim 15, wherein the features have different dimensions, different pitches, or different dimensions and pitches, and wherein the computer is further configured for determining low order aberrations in the lens using the errors.

27. The system of claim 15, wherein the computer is further configured for determining correction terms for one or more parameters of the lithography system as a function of position within the field.

* * * * *